| (12) | United States Patent | (10) Patent No.: | US 7,781,154 B2 |
|---|---|---|---|
| | Parikh | (45) Date of Patent: | Aug. 24, 2010 |

(54) METHOD OF FORMING DAMASCENE STRUCTURE

(75) Inventor: Suketu Arun Parikh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1126 days.

(21) Appl. No.: 11/390,641

(22) Filed: Mar. 28, 2006

(65) Prior Publication Data

US 2007/0231750 A1    Oct. 4, 2007

(51) Int. Cl.
*H01L 21/00* (2006.01)

(52) U.S. Cl. .................. 430/313; 430/316; 430/317; 438/637; 438/643

(58) Field of Classification Search .................. 430/313, 430/316, 317; 438/637, 643
See application file for complete search history.

(56) References Cited

U.S. PATENT DOCUMENTS

| 6,127,263 | A | 10/2000 | Parikh |
|---|---|---|---|
| 6,225,207 | B1 | 5/2001 | Parikh |
| 6,391,771 | B1 | 5/2002 | Naik et al. |
| 6,514,671 | B1 | 2/2003 | Parikh et al. |
| 6,594,540 | B1 | 7/2003 | Parikh |
| 6,656,840 | B2 | 12/2003 | Rajagopalan et al. |
| 6,842,659 | B2 | 1/2005 | Parikh et al. |
| 6,940,170 | B2 | 9/2005 | Parikh |
| 2002/0164870 | A1 | 11/2002 | Cowley et al. |
| 2003/0089987 | A1 | 5/2003 | Parikh |
| 2004/0087166 | A1 | 5/2004 | Morrow |
| 2004/0127016 | A1* | 7/2004 | Hoog et al. .................. 438/637 |
| 2004/0171256 | A1* | 9/2004 | Oladeji et al. ................ 438/689 |
| 2005/0253272 | A1 | 11/2005 | Ohtake et al. |
| 2005/0260856 | A1 | 11/2005 | Kim et al. |
| 2005/0272265 | A1 | 12/2005 | Geffken et al. |

\* cited by examiner

*Primary Examiner*—Thorl Chea
(74) *Attorney, Agent, or Firm*—Patterson & Sheridan, LLP

(57) ABSTRACT

A method for forming a damascene structure utilizes dual hard mask layers and a thin etch stop layer, and does not require a sacrificial layer within the via. A floating etch stop layer can additionally be used. The dual hard masks may be formed of dielectric and neither of the hard masks is required to contain metal. The thin etch stop layer reduces capacitance problems.

26 Claims, 14 Drawing Sheets

METHOD OF FORMING DAMASCENE STRUCTURE

BACKGROUND OF THE INVENTION

1. Field of the Invention

Embodiments of the present invention generally relate to a method of forming a damascene structure and a computer program executable to perform the method.

2. Description of the Related Art

In forming a damascene structure, previous methods have utilized a dual hard mask structure to open up the via and expose the conductive material at the bottom of the via. FIGS. 1A-1D illustrate a typical prior art process scheme. As seen in FIG. 1A, initially, a single etch stop layer 103 is formed over a dielectric layer 101 and a contact area 102. The etch stop layer 103 is about 1,000 Å thick. On top of the etch stop layer 103, another dielectric layer 104, a first hard mask 105, and a second hard mask 106 are formed.

The second hard mask 106 is then patterned. Once the second hard mask 106 is patterned, a sacrificial layer 107 is formed within and on top of the second hard mask 106. Then, a resist 108 is formed on top of the sacrificial layer 107 and is patterned to create a trench pattern 109. The resist 108 is about 1,000 Å thick. The patterned resist 108 is not aligned with the patterned second hard mask 106 (FIG. 1A).

A via pattern 110 as shown in FIG. 1B is then etched into the structure. The patterned resist 108 is removed as is the sacrificial layer 107 and a trench pattern 111 is formed (See FIG. 1B).

A portion of the first hard mask 105 is now exposed. A sacrificial layer 112 is then deposited within via pattern 110 on top of the etch stop layer 103 (see FIG. 1C). The exposed second hard mask 106 is now etched and removed as is a portion of the dielectric layer 104 and all of the sacrificial layer 112 so that a trench pattern 113 and a via pattern 114 are formed (see FIG. 1D).

FIG. 2A-2E show another process scheme of the prior art. As seen in FIG. 2A, initially, a single etch stop layer 203 is formed over a dielectric layer 201 and a contact area 202. On top of the etch stop layer 203, another dielectric layer 204, a first hard mask 205, and a second hard mask 206 are formed. The second hard mask 206 is then patterned through etching. Once the second hard mask 206 is patterned, a sacrificial layer 207 is formed within and on the patterned second hard mask 206. Then, a resist 208 is formed on top of the sacrificial layer 207 and is patterned to form a trench pattern 209. The resist 208 is about 1,500 to about 3,000 Å thick. The patterned resist 208 is not aligned with the patterned second hard mask 206 (FIG. 2A).

The patterned resist 208 is then removed as are the sacrificial layer 207 and the first hard mask 205 that was not covered by the patterned resist 208. Additionally, a portion of dielectric layer 204 is removed down to the etch stop layer 203 so that a via pattern 210 and a trench pattern 211 are formed (See FIG. 2B).

A portion of the first hard mask 205 is now exposed. A sacrificial layer 212 is then deposited within the via pattern 210 and on top of the etch stop layer 203 (see FIG. 2C). A hard mask 213 is formed on top of the sacrificial layer 212. A patterned resist 214 is formed on top of the hard mask 213 forming a trench pattern 215.

Using the patterned resist 214 as a mask, a trench pattern 216 is etched through the hard mask 213 and sacrificial layer 212 leaving the patterned hard mask portions 213A, 213B and sacrificial layer portions 212A-212C (see FIG. 2D). The via is then formed by etching. The sacrificial layer 212B, the hard mask portions 213A, 213B, and the sacrificial layer portions 212A-212C are all removed leaving a via pattern 217 and trench pattern 218 (FIG. 2E).

In each of the above described prior art methods, a sacrificial layer is deposited within the via pattern. The sacrificial layer within the via along the sidewalls of the dielectric layer is a problem. The sacrificial layer will interact with the dielectric layer and poison the structure. Additionally, the topmost hard mask layer is a metal containing hard mask. If the hard mask is not metal containing, then there will be corner chopping of the dielectric layer when the trench is etched. Corner chopping is when material is undesirably removed from a corner of a layer. A metal containing hard mask is more resistant to etching than a dielectric layer. Therefore, the metal containing hard mask will protect the underlying dielectric layers from etching at the corner when forming the trench. There is a drawback to using a metal containing hard mask. In order to remove a metal containing hard mask, an aggressive etchant must be used that can easily damage the damascene structure. In addition to the metal etching, CMP must also be used. Also, the bottom etch stop layer must be thick enough (about 1000 Å) in order to effectively form the via. An etch stop layer that is too thick becomes a problem because of the increased capacitance.

Therefore, there is a need in the art to provide an effective method of forming a damascene structure that solves the problems mentioned above.

SUMMARY OF THE INVENTION

The present invention generally provides methods for forming damascene structures and computer readable programs executable to perform the methods.

In a first embodiment, a method for forming a damascene structure is disclosed. The method comprises depositing at least one lower and at least one upper etch stop layer over a contact layer, depositing a first hard mask, a sacrificial layer, a second hard mask, and a cap layer over the at least one lower and at least one upper etch stop layers, etching through the layers above the at least one etch stop layer to form an opening above the at least one upper etch stop layer, and etching through the at least one lower and at least one upper etch stop layers to expose the contact layer.

In a second embodiment, a method of forming a damascene structure is also disclosed. The method comprises depositing an etch stop layer over a contact layer, depositing a first dielectric layer over the etch stop layer, and depositing a first hard mask layer, a sacrificial layer, a second hard mask layer, and a cap layer over the dielectric layer. Next, the layers above the etch stop layer are etched through to form an opening partially into the dielectric layer so that the etch stop layer is not exposed. Finally, the dielectric layer and the etch stop layer are etched completely through to expose the contact layer.

In a third embodiment, a method of forming a damascene structure is disclosed. The method comprises depositing an etch stop layer over a contact layer, depositing a dielectric layer over the etch stop layer, and depositing a first hard mask layer, a sacrificial layer, a second hard mask layer, and a cap layer. Then, the layers above the etch stop layer are etched to expose the etch stop layer. A barrier antireflective coating is then deposited over the etch stop layer. Finally, the etch stop layer is etched through and the barrier antireflective coating is removed to expose the contact layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1A:
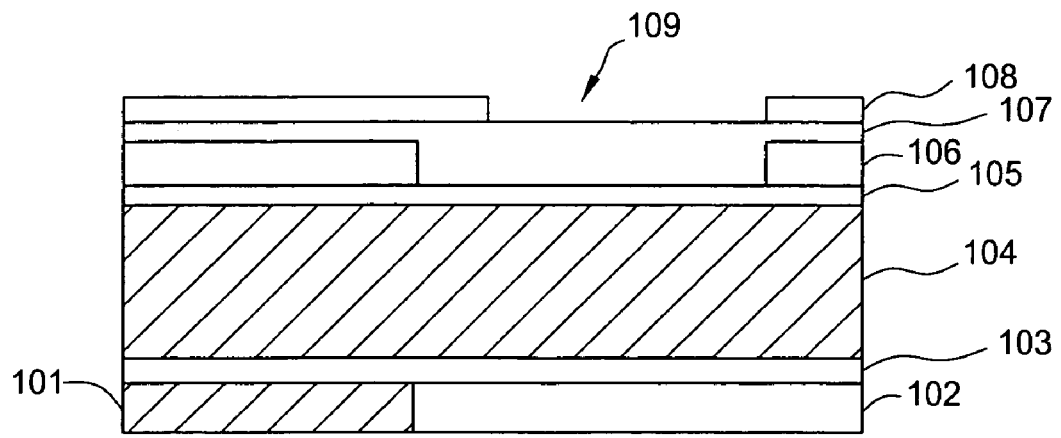
FIGS. 1A-1D illustrate various stages of formation of a damascene structure according to a prior art method.
Figure 1B:
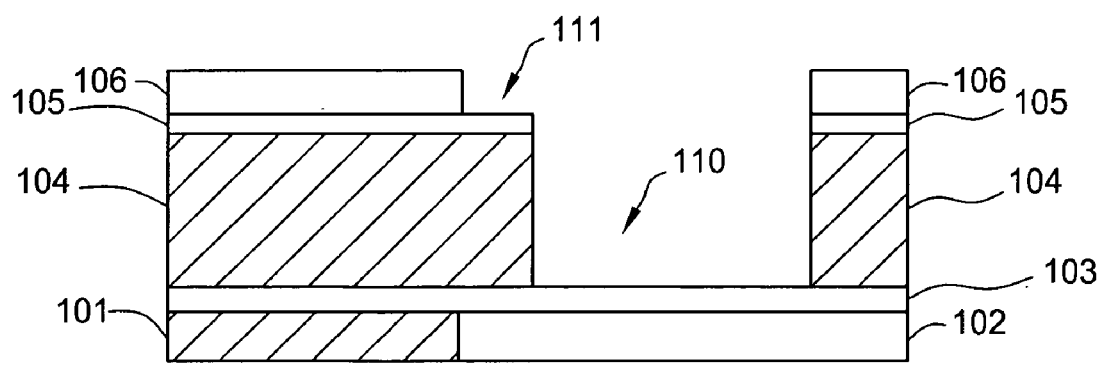
Figure 1C:
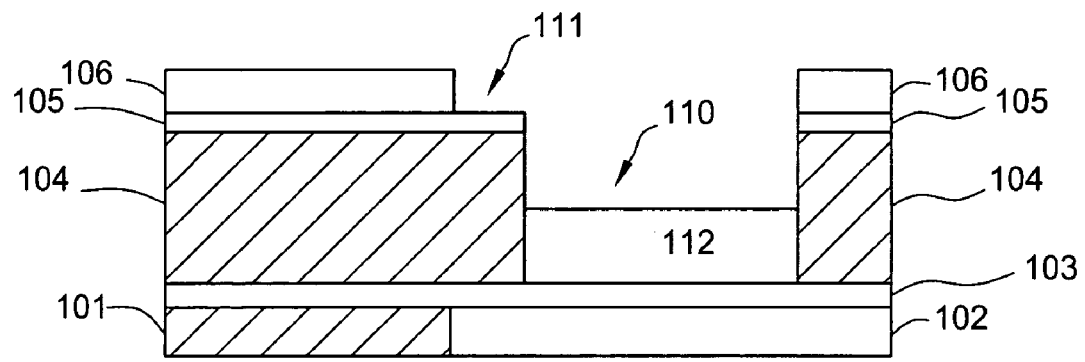
Figure 1D:
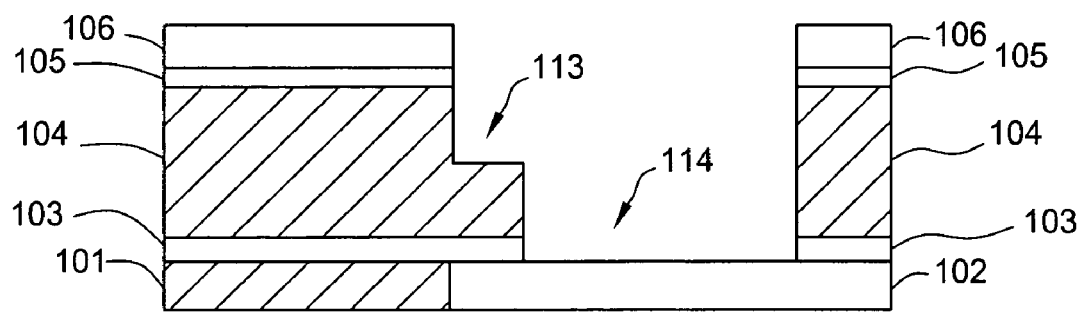
Figure 2A:
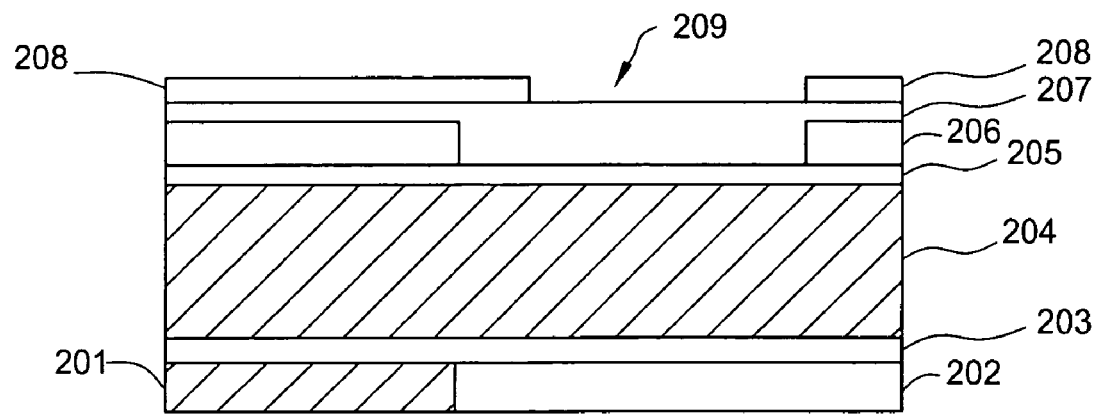
FIGS. 2A-2E illustrate various stages of formation of a damascene structure according to a prior art method.
Figure 2B:
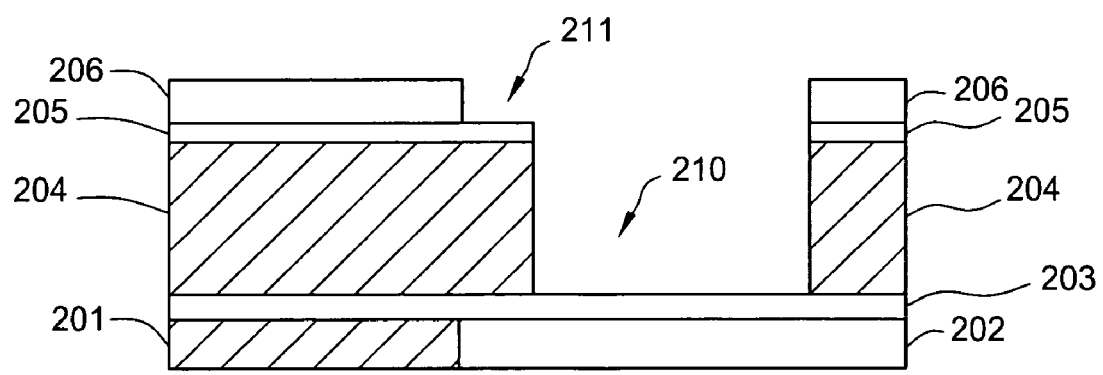
Figure 2C:
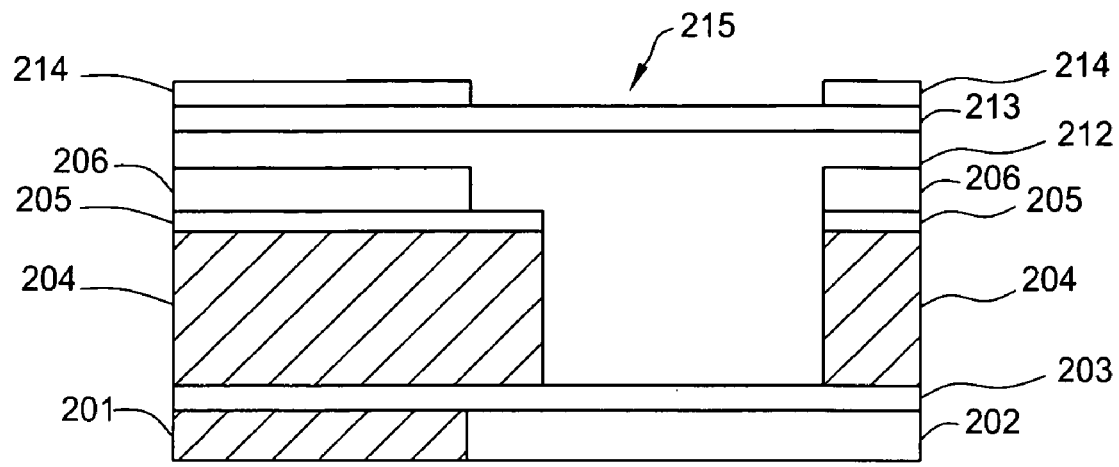
Figure 2D:
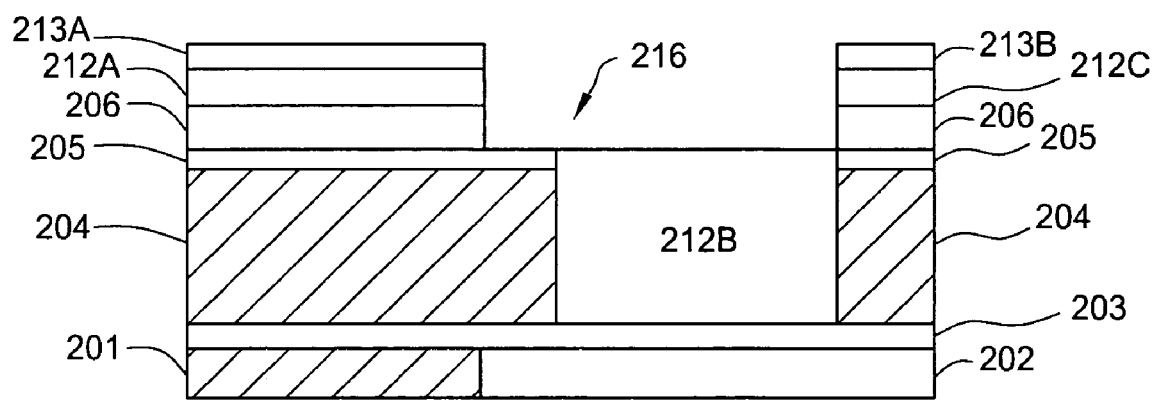
Figure 2E:
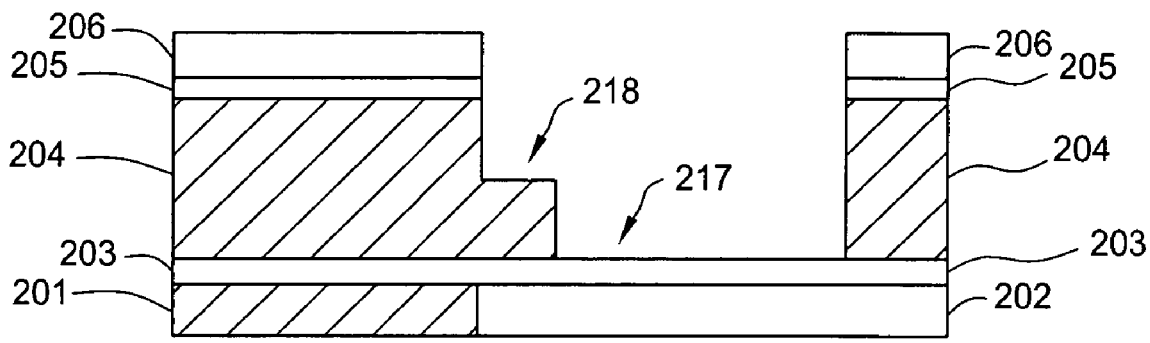

The present invention involves methods for forming damascene structures and computer readable programs executable to perform the methods.

Embodiment 1

To form a damascene structure, a substrate is initially provided. Over the substrate, a dielectric layer 301 is formed. Within the dielectric layer 301, a contact layer 302 is deposited. On top of the dielectric layer 301 and contact layer 302, a first etch stop layer 303 is formed. In one embodiment, the etch stop layer 303 is about 200 to about 500 Å thick. In another embodiment, the etch stop layer 303 is about 250 Å thick. On top of the etch stop layer 303, a first dielectric layer 304 is formed. In one embodiment, the first dielectric layer 304 is about 500 to about 1500 Å thick. In another embodiment, the first dielectric layer 304 is about 1,000 Å thick. On top of the first dielectric layer 304, a second etch stop layer 305 is formed. In one embodiment, the second etch stop layer 305 is about 200 to about 500 Å thick. In another embodiment, the second etch stop layer 305 is about 250 Å thick.

The second etch stop layer 305 is considered to be a floating etch stop layer. By floating etch stop layer it is meant that the second etch stop layer 305 does not always have to be deposited at the same thickness within the structure. The second etch stop layer 305 can be deposited with more or less dielectric layer below the second etch stop layer 305. The location of the second etch stop layer 305 can be tailored to suit the particular etching characteristics of the materials used for the other layers. The location of the second etch stop layer 305 can be tailored to suit the particular etching characteristics of the materials used for the other layers. Additionally, the location of the second etch stop layer 305 can be tailored to be located at the interface of the metal material filling the via and the metal material filling the trench in order to minimize any effect on capacitance.

The second etch stop layer 305 provides the benefits of reducing the capacitance of the structure, having a different etching rate than the surrounding dielectric layers, and controlling the via etching. Because the second etch stop layer 305 is made of a different dielectric material than the dielectric layers, the entire dielectric stack (i.e. the first etch stop layer 303, the first dielectric layer 304, the second etch stop layer 305, and the second dielectric layer 306 can all be deposited in-situ.

Figure 3A:
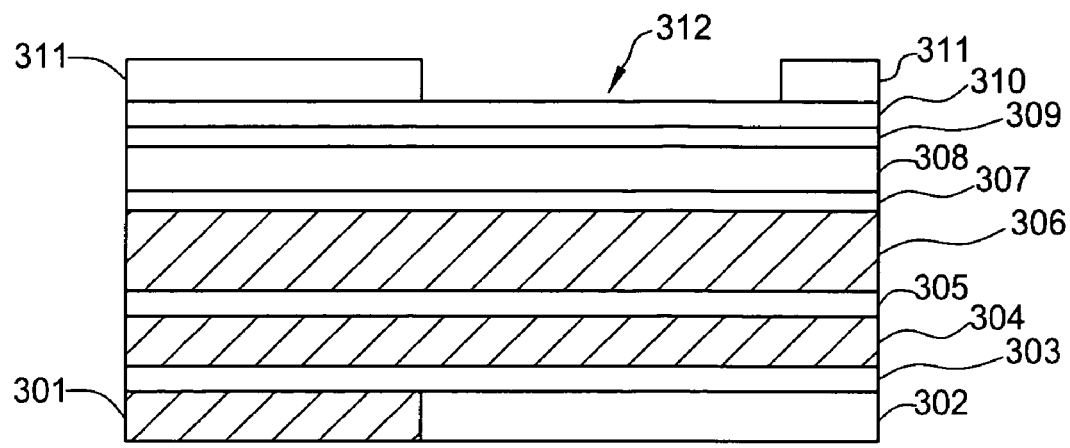
FIGS. 3A-3F illustrate various stages of formation of a damascene structure according to a first embodiment of the invention.

On top of the second etch stop layer 305, a second dielectric layer 306 is formed. In one embodiment, the second dielectric layer 306 is about 3,000 to about 5,000 Å thick. In another embodiment, the second dielectric layer 306 is about 4,000 Å thick. On top of the second dielectric layer 306, a first hard mask 307 is formed. In one embodiment, the first hard mask 307 has a thickness of about 300 to about 2,000 Å. In another embodiment, the thickness is about 1,000 Å. Then, on the first hard mask 307, a sacrificial layer 308 is formed. In one embodiment, the sacrificial layer 308 is about 500 to about 1,000 Å thick. In another embodiment, the sacrificial layer 308 is about 500 Å thick. On the sacrificial layer 308, a second hard mask 309, and a cap layer 310 are formed. In one embodiment, the second hard mask 309 and the cap layer 310 are each formed to a thickness of about 300 to about 2,000 Å. In another embodiment, the thickness is about 1,000 Å. On top of the cap layer 310, a patterned photoresist 311 is formed for making a trench pattern 312 (see FIG. 3A). In one embodiment, the photoresist 311 is about 1,000 to about 4,000 Å thick. In another embodiment, the photoresist 311 is about 1,500 Å thick.

Figure 3B:
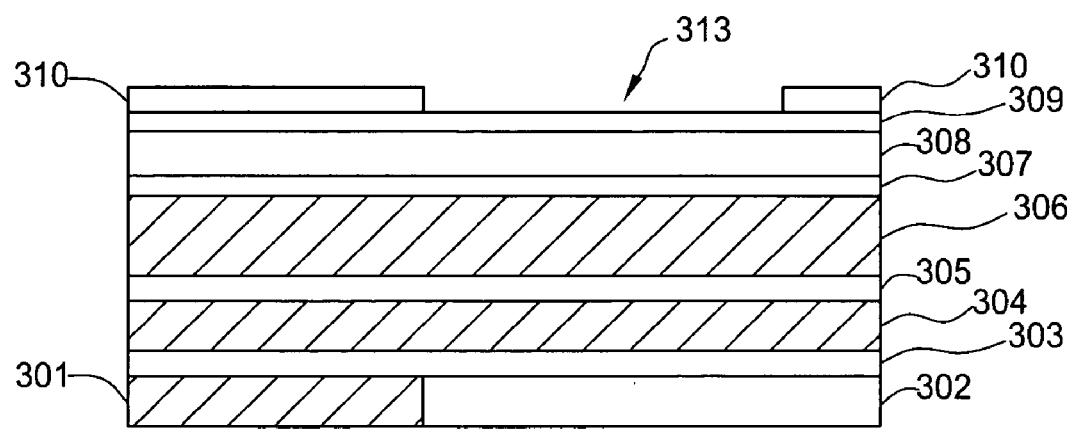
Figure 3C:
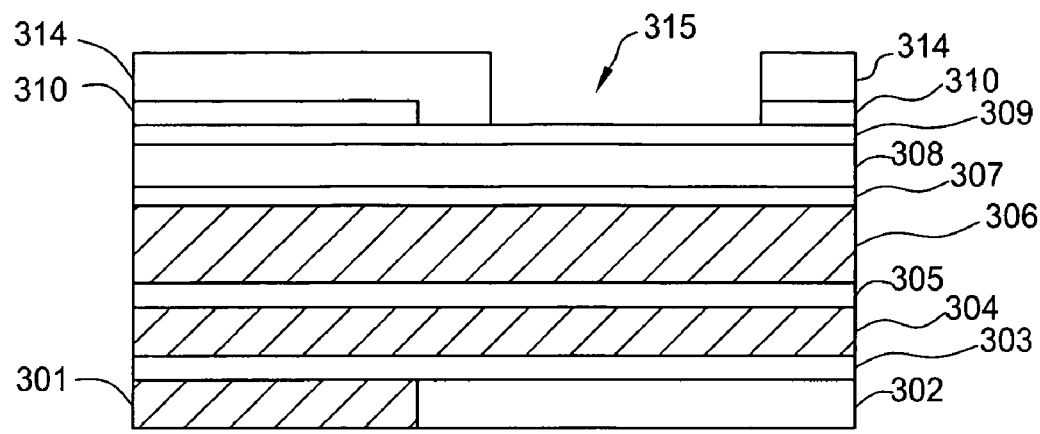

Once the resist has been patterned, the cap layer 310 is etched to leave a first exposed portion of the second hard mask 309 and a trench pattern 313 (see FIG. 3B). On top of the patterned cap layer 310, a photoresist 314 is again deposited and patterned (see FIG. 3C). The patterned photoresist 314 covers the entire cap layer 310. Only a portion of the second hard mask 309 is covered by the patterned photoresist 314, leaving a second exposed portion of the second hard mask 309 and creating a trench pattern 315.

Figure 3D:
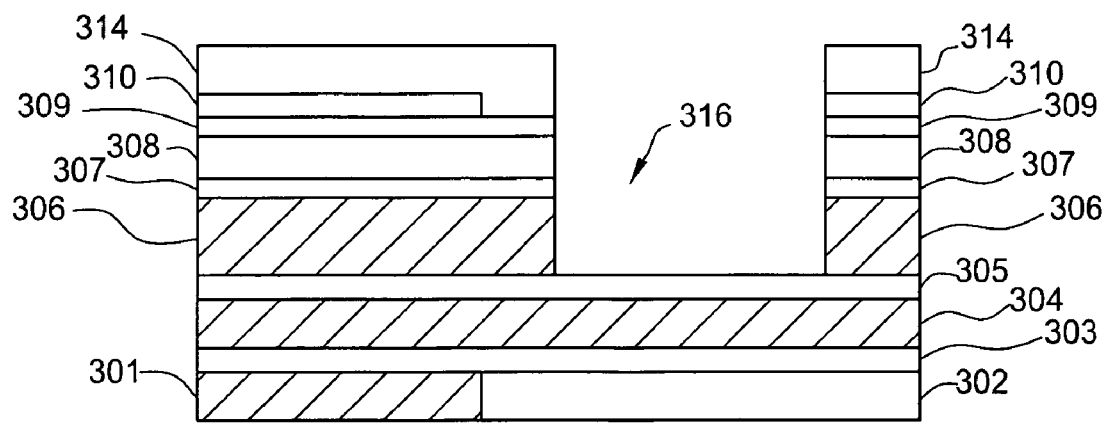

Next, the second exposed portion of the second hard mask 309 is etched through as is the underlying sacrificial layer 308, first hard mask 307, and second dielectric layer 306. The second dielectric layer 306 is etched down to the second etch stop layer 305 so that a portion of the second etch stop layer 305 is exposed. The etching stops at the second etch stop layer 305 so that a via pattern 316 is formed (see FIG. 3D).

Figure 3E:
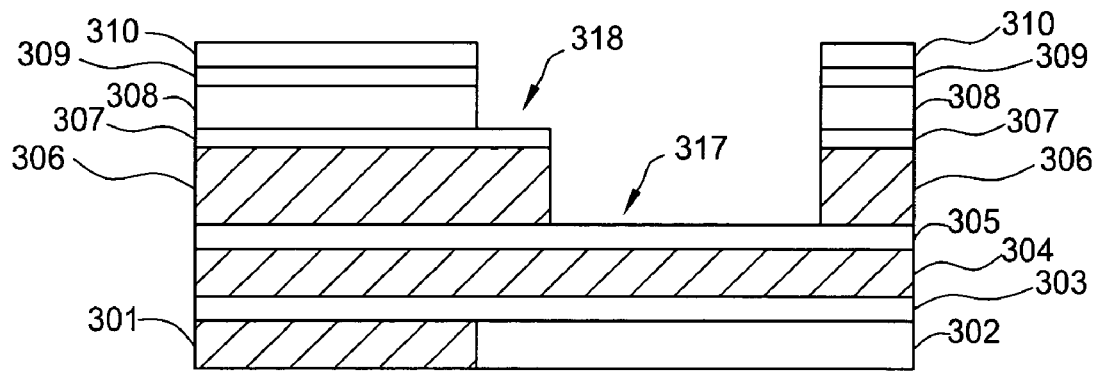

The remaining patterned photoresist 314 is then removed and the pattern is transferred through the sacrificial layer 308 using an anisotropic etch. The etching environment can contain oxygen, ammonium nitride, ammonium nitride-carbon monoxide, or hydrogen based gases. The anisotropic etch serves the dual purpose of stripping the photoresist 314 and transferring the pattern. It is important that the sacrificial layer 308 is not affected between the hard masks 307, 309. During the etching process, the first exposed portion of the second hard mask 309 is etched as is the underlying sacrificial layer 308. The etching exposes a portion of the first hard mask layer 307, but does not remove any of the first hard mask layer 307 so that a trench pattern 318 is formed (see FIG. 3E).

Figure 3F:
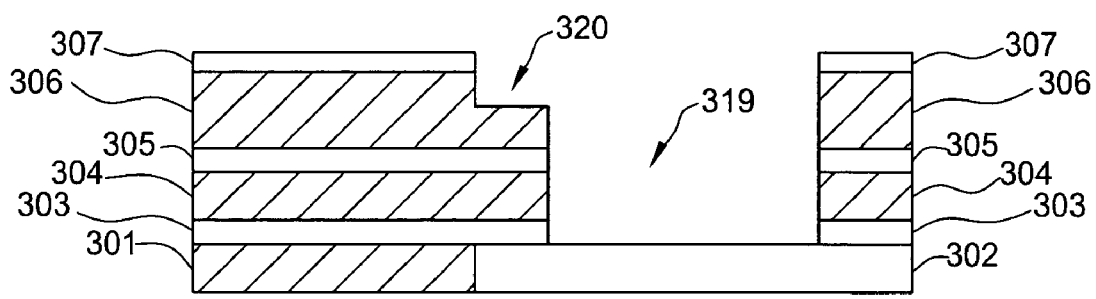

Following the stripping, the cap layer 310, second hard mask layer 309, and sacrificial layers 308 are all removed by etching. In so doing, the exposed first hard mask 307 and a portion of the second dielectric layer 306 are etched to form a trench pattern 320. The exposed second etch stop 305, the first dielectric layer 304, and first etch stop layer 303 are etched to form a via pattern 319 (see FIG. 3F).

Once the via has been etched through to the contact layer 302, conventional methods can be used to complete the structure. For example a barrier layer can be deposited by any conventionally known process such as physical vapor deposition (PVD) or chemical vapor deposition (CVD). Following the barrier layer, an electrochemical plating (ECP) method can be used to deposit a fill layer to fill the via and trench. Once the trench and via are filled, a chemical mechanical polishing (CMP) process can be performed to remove excess material from the top of the structure.

Embodiment 2

Figure 4A:
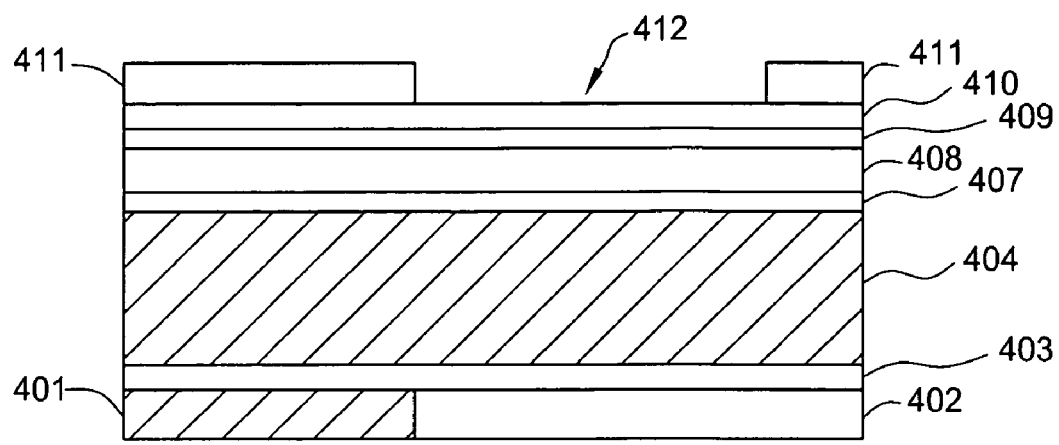
FIGS. 4A-4F illustrate various stages of formation of a damascene structure according to a second embodiment of the invention.

In forming a damascene structure according to a second embodiment of the invention, a substrate is first provided. On top of the substrate, a dielectric layer 401 is formed. Within the dielectric layer 401, a contact layer 402 is deposited. On top of the contact layer 402 and dielectric layer 401, an etch stop layer 403 is formed. In one embodiment, the etch stop layer 403 is about 200 to about 500 Å thick. In another embodiment, the etch stop layer 403 is 250 Å thick. On top of the etch stop layer 403, a dielectric layer 404 is deposited. In one embodiment, the dielectric layer 404 is about 4,000 to about 6,000 Å thick. In another embodiment, the dielectric layer 404 is about 5,000 Å thick. On top of the dielectric layer, a first hard mask 407 is formed. In one embodiment, the first hard mask 407 has a thickness of about 300 to about 2,000 Å. In another embodiment, the thickness is about 1,000 Å. On top of the first hard mask 407, a sacrificial layer 408 is formed. In one embodiment, the sacrificial layer 408 is about 500 to about 1,000 Å thick. In another embodiment, the sacrificial layer 408 is about 500 Å thick. On top of the sacrificial layer 408, a second hard mask 409 and a cap layer 410 are formed. In one embodiment, the second hard mask 409 and the cap layer 410 are each formed to a thickness of about 300 to about 2,000 Å. In another embodiment, the thickness is about 1,000 Å. On top of the cap layer 410, a photoresist layer 411 is formed. The photoresist 411 is patterned to form a trench pattern 412 (see FIG. 4A). In one embodiment, the photoresist 411 is about 1,000 to about 4,000 Å thick. In another embodiment, the photoresist 411 is about 1,500 Å thick.

Figure 4B:
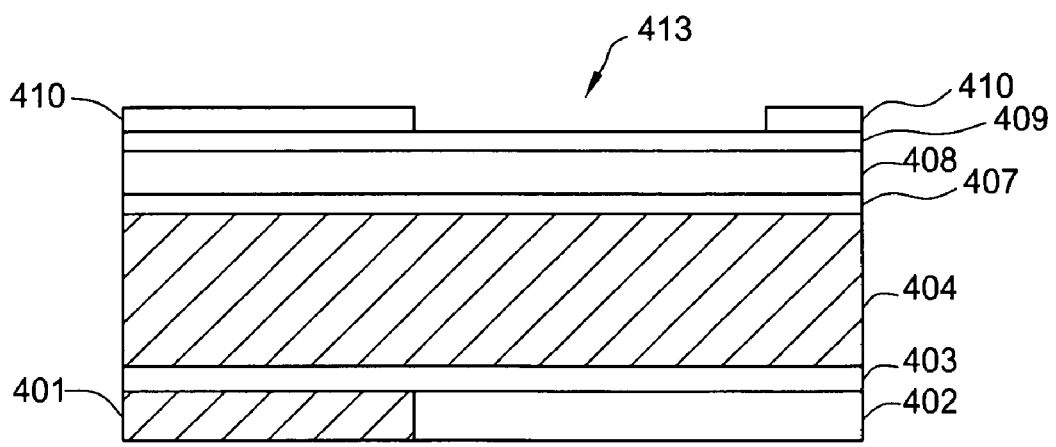
Figure 4C:
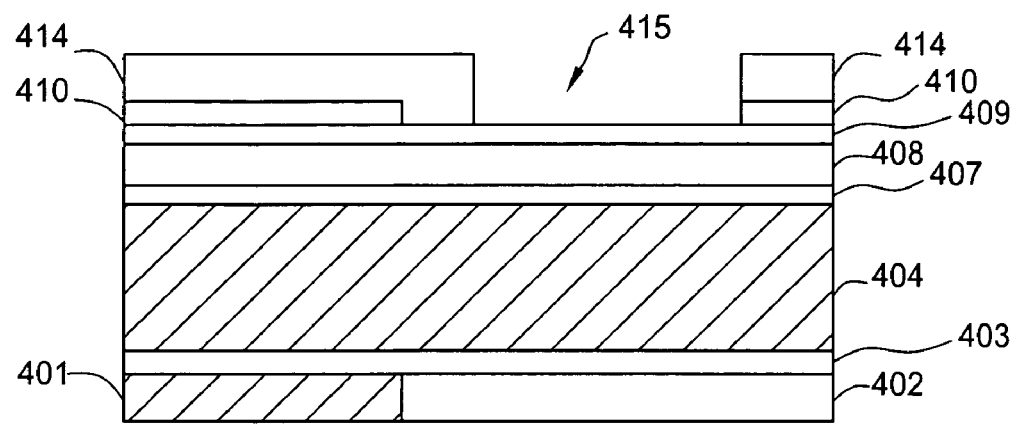

The trench pattern 412 is transferred to the cap layer 410 by etching. Once the cap layer is patterned, a trench pattern 413 is formed that leaves a first exposed portion of the second hard mask 409 (see FIG. 4B). A photoresist 414 is then deposited and patterned to form a trench pattern 415. The patterned resist 414 covers the entire patterned cap layer 410. The resist 414 also covers a portion of the exposed second hard mask 409 (See FIG. 4C), but leaves a second portion of the second hard mask 409 exposed.

Figure 4D:
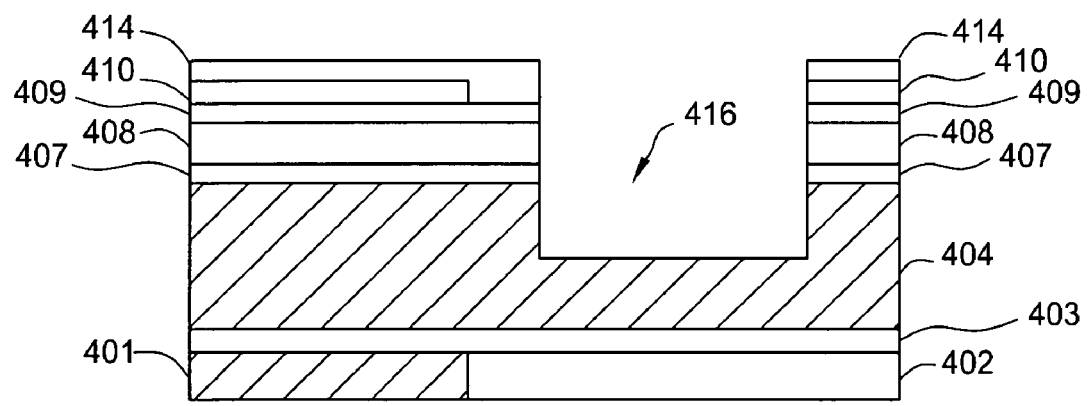

A via pattern 416 is now formed in the structure by etching. The etching involves etching through the exposed second portion of the second hard mask 409, the underlying sacrificial layer 408, the first hard mask 407, and a portion of the dielectric layer 404. The etching is stopped after a specific, user predetermined distance is achieved, for example about 2,000 to about 3,000 Å. In one embodiment, the distance is about 2,500 Å. The resulting structure has an exposed portion of the dielectric layer 404 within the via pattern 416. The top surface of the structure comprises the remaining patterned photoresist 414 (see FIG. 4D).

Figure 4E:
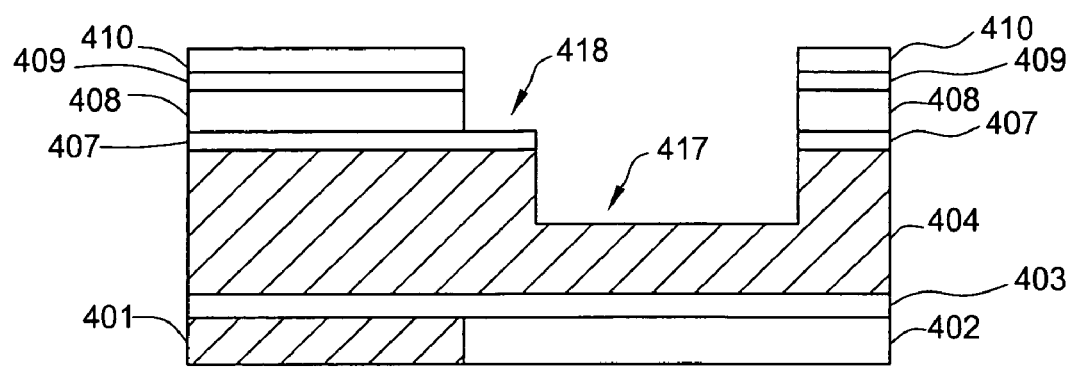

The patterned photoresist 414 is then removed and the pattern is transferred through the sacrificial layer 408 using an anisotropic etch. The etching environment can contain oxygen, ammonium nitride, ammonium nitride-carbon monoxide, or hydrogen based gases. The anisotropic etch serves the dual purpose of stripping the photoresist 414 and transferring the pattern. It is important that the sacrificial layer 408 is not affected between the hard masks 407, 409. The etching is stopped at the first hard mask 407 to create a trench pattern 418 and an exposed portion of the first hard mask layer 407. None of the dielectric layer 404 covered by the first hard mask layer 407 is etched, but a via pattern 417 remains (see FIG. 4E).

Figure 4F:
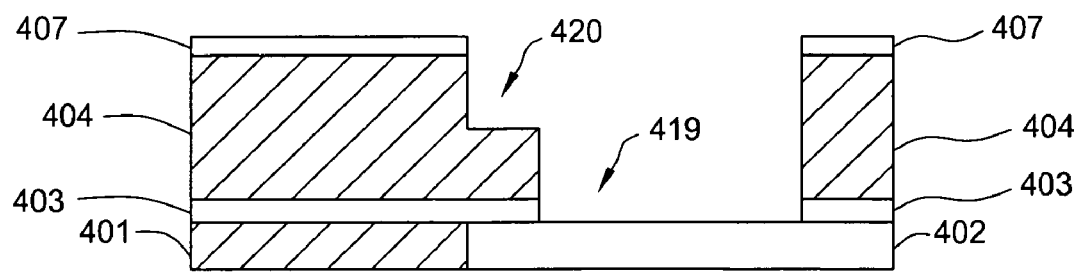

Finally, the via is etched through to the contact layer 402 (see FIG. 4F). The etching involves removing the dielectric layer 404 within the via pattern 419 and the etch stop layer 403. During the etch, the cap layer 410, second hard mask 409, and sacrificial layer 408 are removed. The exposed first hard mask 407 and a portion of the underlying dielectric layer 404 are removed to form a trench pattern 420.

Once the via has been etched through to the contact layer 402, conventional methods can be used to complete the structure. For example a barrier layer can be deposited by any conventionally known process such as physical vapor deposition (PVD) or chemical vapor deposition (CVD). Following the barrier layer, an electrochemical plating (ECP) method can be used to deposit a fill layer to fill the via and trench. Once the trench and via are filled, a chemical mechanical polishing (CMP) process can be performed to remove excess material from the top of the structure.

Embodiment 3

Figure 5A:
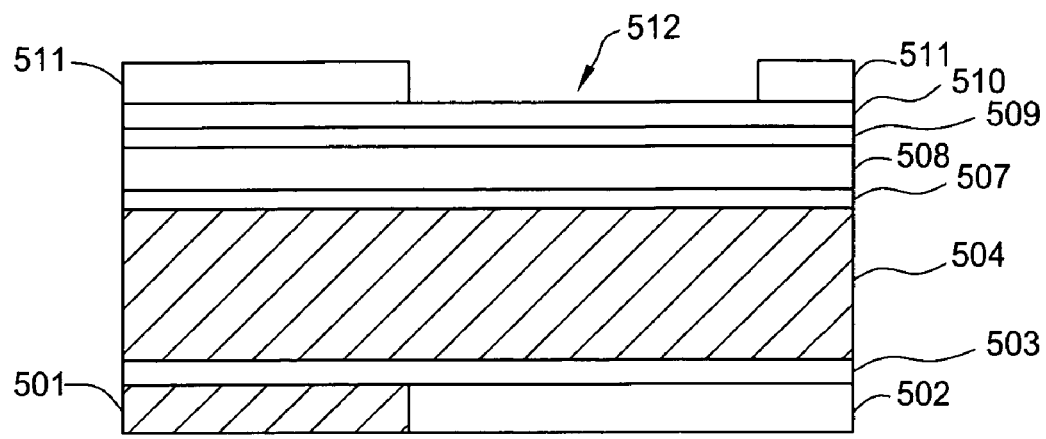
FIGS. 5A-5G illustrate various stages of formation of a damascene structure according to a third embodiment of the invention.

In forming a damascene structure of the third embodiment, a substrate is provided. On top of the substrate, a dielectric layer 501 is deposited. In the dielectric layer 501, a contact layer 520 is deposited. On top of the dielectric layer 501 and contact layer 502, an etch stop layer 503 is deposited. In one embodiment, the etch stop layer 503 is about 200 to about 500 Å thick. In another embodiment, the etch stop layer 503 is about 250 Å thick. On top of the etch stop layer 503, a dielectric layer 504 is deposited. In one embodiment, the dielectric layer 504 is about 4,000 to about 6,000 Å thick. In another embodiment, the dielectric layer 504 is about 5,000 Å thick. On top of the dielectric layer 504, a first hard mask 507 is deposited. In one embodiment, the first hard mask 507 has a thickness of about 300 to about 2,000 Å. In another embodiment, the thickness is about 1,000 Å. On top of the first hard mask 507, a sacrificial layer 508 is deposited. In one embodiment, the sacrificial layer 508 is about 500 to about 1,000 Å thick. In another embodiment, the sacrificial layer 508 is about 500 Å thick. On top of the sacrificial layer 508, a second hard mask 509, and a cap layer 510 are deposited. In one embodiment, the second hard mask 509 and the cap layer 510 are each formed to a thickness of about 300 to about 2,000 Å. In another embodiment, the thickness is about 1,000 Å. On top of the cap layer 510, a photoresist layer 511 is deposited. The photoresist layer 511 is patterned to form a trench pattern 512 (see FIG. 5A). In one embodiment, the photoresist 511 is about 1,000 to about 4,000 Å thick. In another embodiment, the photoresist 511 is formed to a thickness of about 1,500 Å.

Figure 5B:
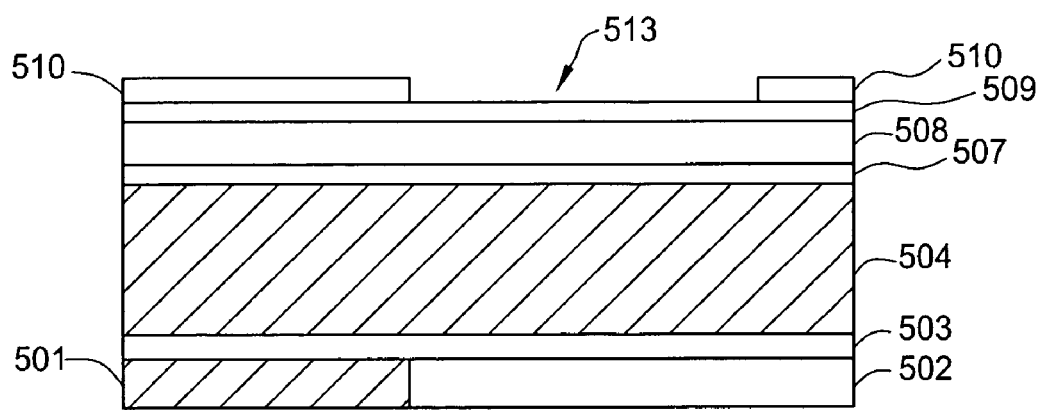
Figure 5C:
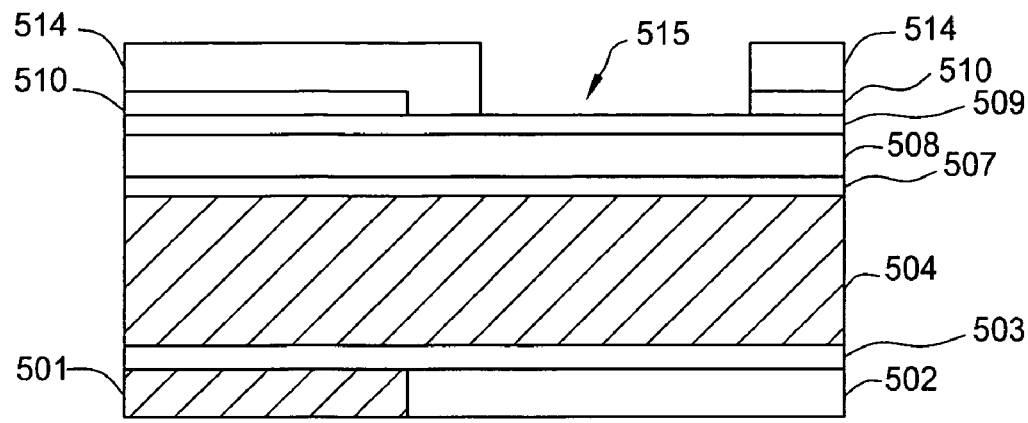

Once the photoresist 511 is patterned, the exposed cap layer 510 is etched (see FIG. 5B) to form a trench pattern 513 and to remove the photoresist 511. Next, photoresist 514 is deposited on the cap layer 510 and patterned to form a trench pattern 515 (FIG. 5C). As can be seen from FIG. 5C, there is an exposed portion of the second hard mask 509 and a portion that is covered by the photoresist 514.

Figure 5D:
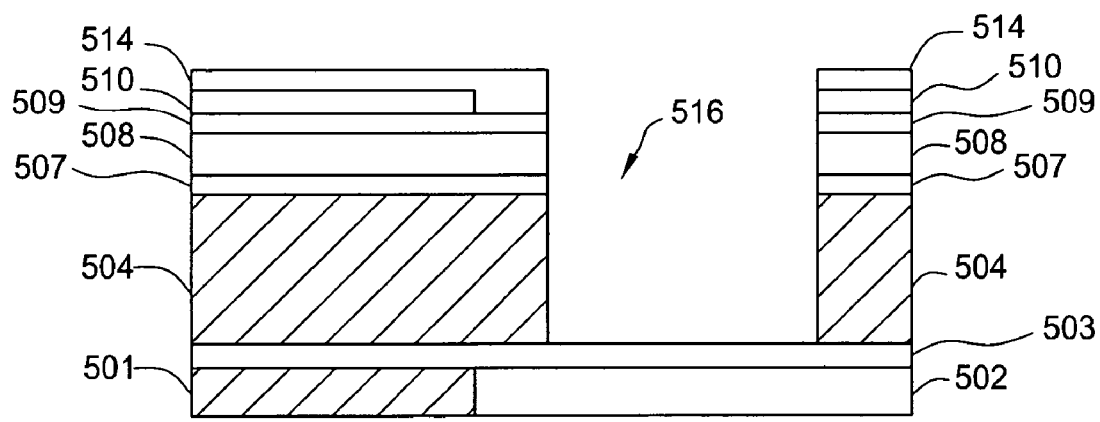

A portion of the photoresist 514 and the exposed second hard mask 509 are removed by etching. The etching also removes portions of the sacrificial layer 508, first hard mask 507, and dielectric layer 504 that lie under the exposed second hard mask 509 so that a via pattern 516 is formed. The etching exposes a portion of the etch stop layer 503 (see FIG. 5D).

Figure 5E:
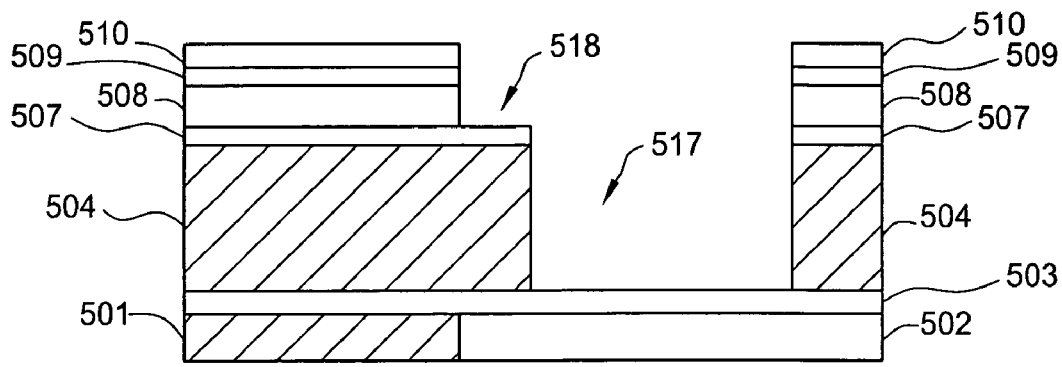

Next, the remaining photoresist 514 is removed and the pattern is transferred through the sacrificial layer 508 using an anisotropic etch. The etching environment can contain oxygen, ammonium nitride, ammonium nitride-carbon monoxide, or hydrogen based gases. The anisotropic etch serves the dual purpose of stripping the photoresist 514 and transferring the pattern. It is important that the sacrificial layer 508 is not affected between the hard masks 507, 509. During the etching, the portion of the second hard mask 509 previously covered by the photoresist 514, and the sacrificial layer 508 underlying the second hard mask 509 are removed. The etching is stopped on the first hard mask 507 so that a trench pattern 518 and a via pattern 517 are formed (see FIG. 5E).

Figure 5F:
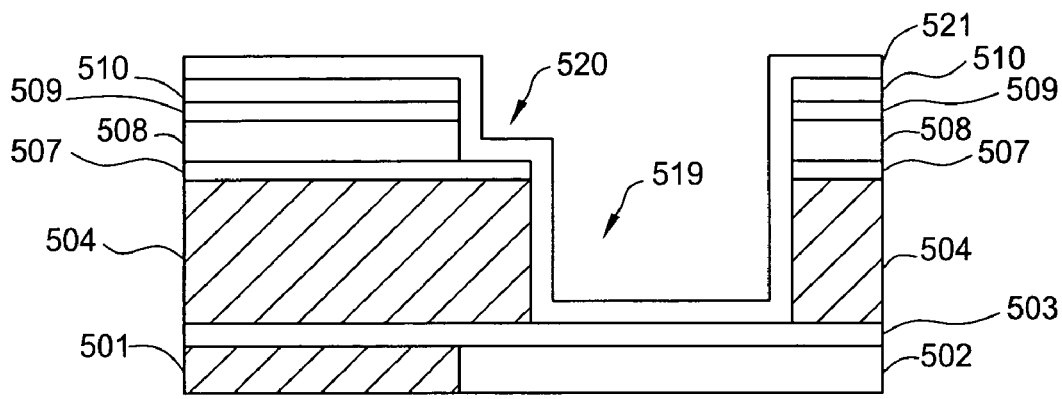

The next step is to deposit a barrier antireflective coating (BARC) 521 on the structure. In one embodiment, the BARC 521 has a thickness of about 100 to about 200 Å. In another embodiment, the BARC 521 is about 150 Å. The BARC 521 covers all surfaces that lie within the via pattern 519 and trench pattern 520 and partially fills the via pattern 519 and trench pattern 520 (See FIG. 5F). The BARC 521 protects the dielectric layer 504 during etching.

Figure 5G:
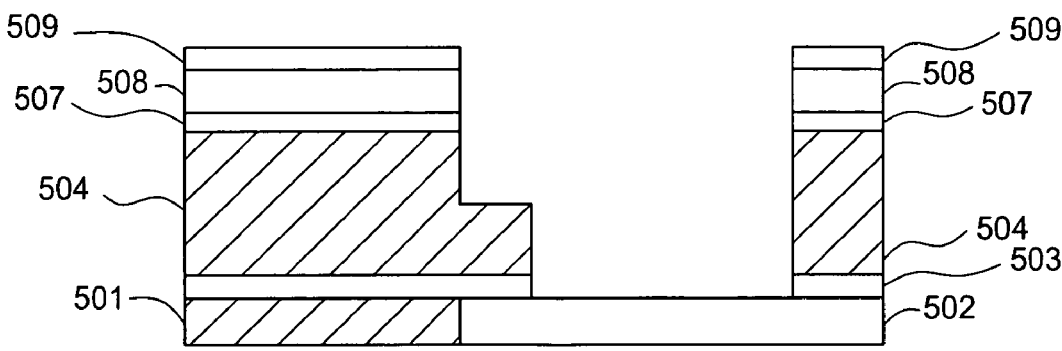

Finally, the contact layer 502 is opened by etching to remove the BARC layer 521 and the etch stop layer 503 covering the contact layer 502. The BARC 521 is removed entirely. The etching also removes the exposed first hard mask 507 and a portion of the dielectric layer 504 (see FIG. 5G).

Once the via has been etched through to the contact layer 502, conventional methods can be used to complete the structure. For example a barrier layer can be deposited by any conventionally known process such as physical vapor deposition (PVD) or chemical vapor deposition (CVD). Following the barrier layer, an electrochemical plating (ECP) method can be used to deposit a fill layer to fill the via and trench. Once the trench and via are filled, a chemical mechanical polishing (CMP) process can be performed to remove excess material from the top of the structure.

The above approaches prevent resist/low-k dielectric interaction. Therefore, the resist does not poison the dielectric and there is no low-k dielectric damage during the stripping process. The above schemes are beneficial for porous low-k dielectric materials and regular low-k dielectric materials. Also, there is no need for a metal hard mask in the above schemes because the sacrificial layer minimizes corner chopping while the trench is being etched. The etch stop layer is significantly thinner than the prior art etch stop layers. The thinner etch stop layer does not increase capacitance as much as the prior art etch stop layers. All of the dielectric layers (i.e. etch stop layers and dielectric layers) can be deposited in-situ. Additionally, all of the etching steps can be performed in-situ.

Additionally, the above schemes allow thin resists to be used for the trench etches and are beneficial for trench depths greater than 90 nm as well as trench depths of 32 nm to 90 nm technology node The overall feature size is from about 32 nm to about 200 nm.

The substrate can be any conventionally used semiconductor wafer such as silicon, silicon on insulator, or silicon-germanium. The dielectric layers are formed of any dielectric material conventional within the art such as black diamond, OMCTS, fluorosilicate glass, undoped silicate glass, spin on low-k films, polymer based low-k films such as SILK, porous $SiO_2$, aero gels, and other conventional dielectric materials. Low-k dielectric materials are particularly preferred such as black diamond. The hard mask layers can be made of any suitable dielectric material such as SiN, SiC, SiOC, or SiOCN. The cap layer can be formed any dielectric material with $SiO_2$ being particularly preferred. The bi-layer structure (i.e. the hard mask with cap layer thereon) can be an oxide over nitride combination or an oxide over carbide combination or an oxide over alpha-carbon combination. The etch stop layers can be formed of any conventional etch stop materials such as SiC, SiN, and SiCN for example.

Examples of suitable dielectric materials include oxides such as PECVD (plasma-enhanced chemical vapor deposition) $SiO_2$ and F—$SiO_2$, while suitable dielectric materials for the other dielectric layer include polymers, such as, amorphous fluorinated carbon based materials, spin-on dielectric polymers such as fluorinated and non-fluorinated poly (arylene) ethers (commercially known as FLARE® 1.0 and 2.0, which are available from Allied Signal Company), poly (arylene) ethers (commercially known as PAE® 2-3, available from Schumacher Company), divinyl siloxane benzocyclobutane (DVS-BCB) or similar products and aero-gel. These dielectric materials are well known to those of ordinary skill in the art. The oxides and the polymers have dissimilar etching characteristics because the $O_2$-based etch chemistry used for etching of polymer is highly selective with respect to $SiO_2$. On the other hand, the $CHF_x$-based etch chemistry for etching $SiO_2$ of low-k is highly selective with respect to polymer, resist, or hard mask.

Desirably, dielectric materials for use in damascene structures exhibit high mechanical strength and a low k (dielectric constant). As defined to herein, the term "low k material" refers to dielectric materials wherein k=1-3.5. "High k material" as defined herein refers to dielectric materials wherein k>3.5. As is well known to those of ordinary skill in the art, low k materials such as the following materials have relatively low physical strength. For example, such low k materials as polymers, e.g. poly(arylene) ethers, fluorinated poly(arylene) ethers and divinyl siloxane benzocyclobutane, or aero gel have relatively low mechanical strength and films composed of these materials are generally prone to cracking unless the layer is very thin. Also, high aspect lines of these materials are likely to collapse. However, use of low k materials is highly desirable because of their superior dielectric properties, such as reduced capacitance and reduced power loss as compared with higher k materials such as $SiO_2$.

The sacrificial layer can be formed of any conventional sacrificial material such as BARC material, photo resist material, amorphous carbon, silicon based material, or organic polymer.

While the foregoing is directed to embodiments of the present invention, other and further embodiments of the invention may be devised without departing from the basic scope thereof, and the scope thereof is determined by the claims that follow.

The invention claimed is:

1. A method for forming a damascene structure comprising:
   depositing a lower and an upper etch stop layer over a contact layer;
   depositing a dielectric layer over the upper etch stop layer;
   depositing a first hard mask layer over the dielectric layer;
   depositing a sacrificial layer over the first hard mask layer;
   depositing a second hard mask layer over the sacrificial layer;
   depositing a cap layer above the second hard mask layer;
   etching through the cap layer, the second hard mask layer, the sacrificial layer, the first hard mask layer, and the dielectric layer above the upper etch stop layer to form an opening above the upper etch stop layer; and
   etching through the lower and upper etch stop layers to expose the contact layer.

2. The method as claimed in claim 1, wherein said etch stop layers are selected from the group consisting of SiN, SiC, SiOC, and SiOCN.

3. The method as claimed in claim 1, wherein said cap layer comprises $SiO_2$.

4. The method as claimed in claim 1, wherein said first and second hard mask layers comprise a dielectric material.

5. The method as claimed in claim 4, wherein said dielectric material comprises SiN.

6. The method as claimed in claim 1, further comprising depositing a dielectric layer between said lower etch stop layer and said at upper etch stop layer.

7. The method as claimed in claim 1, wherein said depositing is conducted in-situ.

8. The method as claimed in claim 1, wherein said etching is conducted in-situ.

9. The method as claimed in claim 1, wherein etching through the cap layer, the second hard mask layer, the sacrificial layer and the first hard mask layer above the upper etch stop layer to form an opening above the upper etch stop layer comprises:
  etching the cap layer to expose the second hard mask layer and form a first pattern in the cap layer; and
  etching through an exposed portion of the second hard mask layer, the sacrificial layer, the first hard mark layer and the dielectric layer to expose the upper etch stop layer.

10. A method of forming a damascene structure comprising:
  depositing an etch stop layer over a contact layer;
  depositing a dielectric layer over the etch stop layer;
  depositing a first hard mask layer over the dielectric layer;
  depositing a sacrificial layer over the first hard mask layer;
  depositing a second hard mask layer over the sacrificial layer;
  depositing a cap layer above the second hard mask layer;
  etching through the cap layer, and second hard mask layer, the sacrificial layer, and the first hard mask layer above the etch stop layer to form an opening that is formed partially into the dielectric layer so that the etch stop layer is not exposed; and
  etching completely through said dielectric layer and said etch stop layer to expose the contact layer.

11. The method as claimed in claim 10, wherein said etch stop layer is selected from the group consisting of SiN, SiC, SiOC, and SiOCN.

12. The method as claimed in claim 10, wherein said cap layer comprises $SiO_2$.

13. The method as claimed in claim 10, wherein said dielectric layer is a low-k dielectric layer.

14. The method as claimed in claim 10, wherein said first and second hard mask layers comprise a dielectric material.

15. The method as claimed in claim 14, wherein said dielectric material comprises SiN.

16. The method as claimed in claim 10, wherein a width of the opening that is formed partially through the dielectric layer is equal to a width of a via opening that exposes the contact layer.

17. The method as claimed in claim 10, wherein said depositing is conducted in-situ.

18. The method as claimed in claim 10, wherein said etching is conducted in-situ.

19. A method of forming a damascene structure comprising:
  depositing an etch stop layer over a contact layer;
  depositing a dielectric layer over the etch stop layer;
  depositing a first hard mask layer over the dielectric layer;
  depositing a sacrificial layer over the first hard mask layer;
  depositing a second hard mask layer over the sacrificial layer;
  depositing a cap layer above the second hard mask layer;
  etching through the cap layer, the second hard mask layer, the sacrificial layer, the first hard mask layer and the dielectric layer above the etch stop layer to expose the etch stop layer;
  depositing a barrier antireflective coating; and
  etching through said etch stop layer and said barrier antireflective coating to expose the contact layer.

20. The method as claimed in claim 19, wherein said etch stop layer is selected from the group consisting of SiN, SiC, SiOC, and SiOCN.

21. The method as claimed in claim 19, wherein said cap layer comprises $SiO_2$.

22. The method as claimed in claim 19, wherein said dielectric layer is a low-k dielectric layer.

23. The method as claimed in claim 19, wherein said first and second hard mask layers comprise a dielectric material.

24. The method as claimed in claim 23, wherein said dielectric material comprises SiN.

25. The method as claimed in claim 19, wherein said depositing is conducted in-situ.

26. The method as claimed in claim 19, wherein said etching is conducted in-situ.

* * * * *